US008785243B2

(12) United States Patent
Ahn et al.

(10) Patent No.: US 8,785,243 B2
(45) Date of Patent: Jul. 22, 2014

(54) METHOD FOR MANUFACTURING A THIN FILM TRANSISTOR ARRAY PANEL

(75) Inventors: Byung Du Ahn, Hwaseong-si (KR); Jun Hyung Lim, Seoul (KR); Jin Seong Park, Cheonan-si (KR)

(73) Assignees: Samsung Display Co., Ltd., Yongin (KR); Industry-Academic Cooperation Foundation Dankook University, Yongin-si (KR)

( * ) Notice: Subject to any disclaimer, the term of this patent is extended or adjusted under 35 U.S.C. 154(b) by 4 days.

(21) Appl. No.: 13/567,823

(22) Filed: Aug. 6, 2012

(65) Prior Publication Data

US 2013/0260497 A1 Oct. 3, 2013

(30) Foreign Application Priority Data

Apr. 2, 2012 (KR) .......................... 10-2012-0034100

(51) Int. Cl.
*H01L 21/00* (2006.01)
*H01L 21/16* (2006.01)
*H01L 21/02* (2006.01)

(52) U.S. Cl.
CPC ..... *H01L 21/02565* (2013.01); *H01L 21/02656* (2013.01)
USPC .......................................................... 438/104

(58) Field of Classification Search
CPC ................... H01L 21/02565; H01L 21/02656
USPC .......................................................... 438/104
See application file for complete search history.

(56) References Cited

U.S. PATENT DOCUMENTS

| 7,189,992 | B2 | 3/2007 | Wager, III et al. |
| 7,470,607 | B2 | 12/2008 | Carcia et al. |
| 7,674,650 | B2 | 3/2010 | Akimoto et al. |
| 7,888,207 | B2 | 2/2011 | Wager, III et al. |
| 8,274,078 | B2 * | 9/2012 | Itagaki et al. ................. 257/43 |
| 2006/0110867 | A1 | 5/2006 | Yabuta et al. |
| 2007/0141784 | A1 | 6/2007 | Wager, III et al. |

(Continued)

FOREIGN PATENT DOCUMENTS

| CN | 101548388 | 9/2009 |
| EP | 2084749 | 5/2008 |

(Continued)

OTHER PUBLICATIONS

Ji et al., "Effect of high-pressure oxygen annealing on negative bias illumination stress-induced instability of InGaZnO thin film transistors", Applied Physics Letters, vol. 98, 2011, pp. 103509-1 to pp. 103509-3.*

(Continued)

*Primary Examiner* — William D Coleman
(74) *Attorney, Agent, or Firm* — H.C. Park & Associates, PLC

(57) ABSTRACT

A method for manufacturing a thin film transistor array panel according to an exemplary embodiment of the present invention includes, forming a gate electrode, a gate insulating layer, and an oxide semiconductor layer on a substrate, first heat treating the substrate comprising the oxide semiconductor layer, forming a source electrode and a drain electrode on the oxide semiconductor layer, the source and drain electrodes facing each other, and forming a passivation layer on the source electrode and the drain electrode. The first heat treating is performed at more than 1 atmosphere and at most 50 or less atmospheres.

17 Claims, 13 Drawing Sheets

(56) References Cited

U.S. PATENT DOCUMENTS

| | | |
|---|---|---|
| 2008/0108198 A1 | 5/2008 | Wager, III et al. |
| 2009/0035899 A1 | 2/2009 | Herman et al. |
| 2009/0186445 A1 | 7/2009 | Akimoto |
| 2009/0269880 A1 | 10/2009 | Itagaki et al. |
| 2009/0325341 A1 | 12/2009 | Itagaki et al. |
| 2010/0203673 A1 | 8/2010 | Hayashi et al. |

FOREIGN PATENT DOCUMENTS

| | | |
|---|---|---|
| JP | 2007281409 | 10/2007 |
| JP | 2008130814 | 6/2008 |
| JP | 2009010362 | 1/2009 |
| JP | 2009099953 | 5/2009 |
| KR | 1020090086602 | 8/2009 |
| KR | 1020100002899 | 1/2010 |
| KR | 1020100010300 | 2/2010 |
| WO | 2008/062720 | 5/2008 |
| WO | 2009/041713 | 4/2009 |

OTHER PUBLICATIONS

Kwang Hwan Ji, et al., "Effect of high-pressure oxygen annealing on negative bias illumination stress-induced instability of InGaZnO thin film transistors", Applied Physics Letters, Mar. 10, 2011, vol. 98, Issue 10, P. 103509-1-103509-3, American Institute of Physics, USA.

* cited by examiner

METHOD FOR MANUFACTURING A THIN FILM TRANSISTOR ARRAY PANEL

CROSS-REFERENCE TO RELATED APPLICATION

This application claims priority from and the benefit of Korean Patent Application No. 10-2012-0034100, filed on Apr. 2, 2012, which is incorporated herein by reference for all purposes as if fully set forth herein.

BACKGROUND OF THE INVENTION

1. Field of the Invention

Exemplary embodiments of the present invention relate to a method for manufacturing a thin film transistor array panel. In particular, exemplary embodiments of the present invention provide a method for manufacturing a thin film transistor array panel including a thin film transistor having thermal stability.

2. Discussion of the Background

Flat panel displays such as a liquid crystal display (LCD), an organic light emitting diode (OLED) display, an electrophoretic display, a plasma display, and the like include multiple pairs of electric field generating electrodes and an electro-optical active layer interposed therebetween.

The liquid crystal display includes a liquid crystal layer as the electro-optical active layer, and the organic light emitting display includes an organic light emitting layer as the electro-optical active layer.

Any one of a pair of electric field generating electrodes is generally connected to a switching element to receive an electrical signal, and the electro-optical active layer converts the electric signal into an optical signal to display an image.

The flat panel display may include a display panel having a thin film transistor. The thin film transistor array panel is patterned to have multiple electrodes and semiconductors, and masks are generally used in the patterning process.

On the other hand, the material of the semiconductor is an important factor in determining the characteristics of the thin film transistor.

The semiconductor is usually made of amorphous silicon. However, the charge mobility thereof is low such that there is a limit in manufacturing a high performance thin film transistor.

Also, when using polysilicon, the charge mobility is high such that manufacturing of the high performance thin film transistor is easy, however the cost is high and uniformity is low such that there is a limit in manufacturing a large-sized thin film transistor array panel.

Accordingly, a thin film transistor using an oxide semiconductor having high charge mobility and a high ON/OFF ratio of current compared with amorphous silicon and having a low cost and high uniformity compared with polysilicon has been researched.

For a characteristic of the channel layer of the oxide semiconductor, a high temperature heat treatment is performed after forming the source electrode and the drain electrode.

However, thermal stability between the metal material forming the source electrode and drain electrode, and the oxide semiconductor, is decreased such that the channel characteristic may be deteriorated.

The above information disclosed in this Background section is only for enhancement of understanding of the background of the invention and therefore it may contain information that does not form the prior art that is already known in this country to a person of ordinary skill in the art.

SUMMARY OF THE INVENTION

Exemplary embodiments of the present invention provide a method for manufacturing a thin film transistor array panel including a thin film transistor having thermal stability.

Additional features of the invention will be set forth in the description which follows, and in part will be apparent from the description, or may be learned by practice of the invention.

An exemplary embodiment of the present invention discloses a method for manufacturing a thin film transistor array panel which includes: forming a gate electrode, a gate insulating layer, and an oxide semiconductor layer on a substrate; first heat treating the substrate comprising the oxide semiconductor layer; forming a source electrode and a drain electrode on the oxide semiconductor layer, the source and drain electrodes facing each other; and forming a passivation layer on the source electrode and the drain electrode. The first heat treating is performed at more than 1 atmosphere and at most 50 or less atmospheres.

Another exemplary embodiment of the present invention discloses a method for manufacturing a thin film transistor which includes: forming a first electrode, an insulating layer, and an oxide semiconductor layer on a substrate; forming an etch stopper on the oxide semiconductor layer at a location corresponding to the first electrode; heat treating the substrate comprising the oxide semiconductor layer under a pressurized state higher than 1 atmosphere; forming a second electrode and a third electrode to overlap edges of the etch stopper on the oxide semiconductor layer; and forming a passivation layer on the second electrode and the third electrode.

According to an exemplary embodiment of the present invention, the heat treatment process is performed in a pressurized state such that the characteristic of the thin film transistor may be improved.

It is to be understood that both the foregoing general description and the following detailed description are exemplary and explanatory and are intended to provide further explanation of the invention as claimed.

DETAILED DESCRIPTION OF THE ILLUSTRATED EMBODIMENTS

Figure 1:
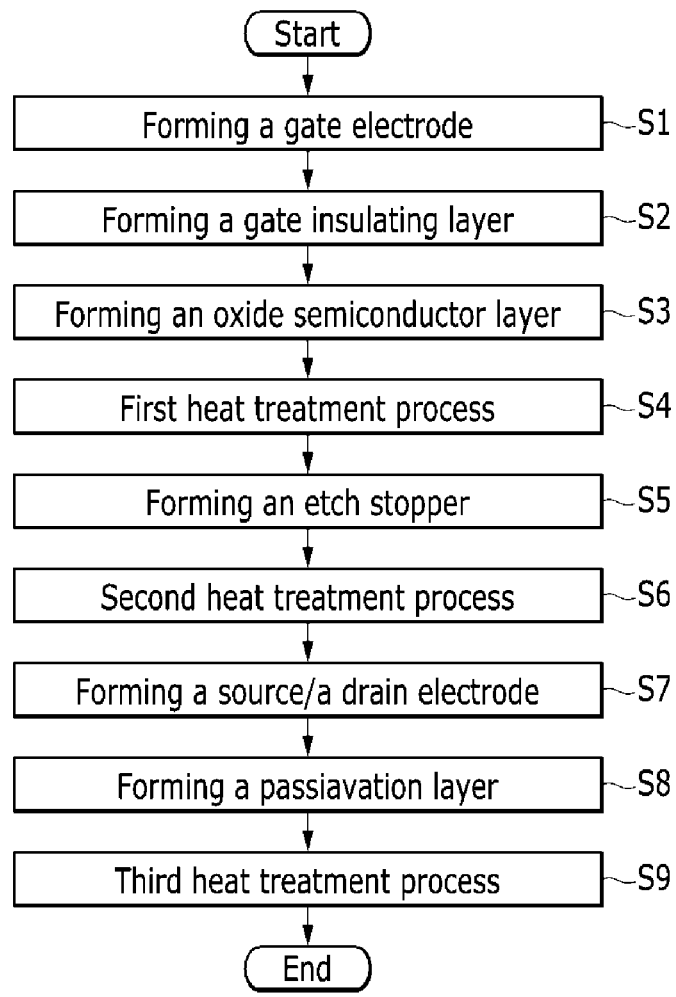
FIG. 1 is a flowchart showing a method for manufacturing a thin film transistor array panel according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., may be exaggerated for clarity. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. In contrast, It will be understood that when an element such as a layer, film, region, or substrate is referred to as being "beneath" another element, it can be directly beneath the other element or intervening elements may also be present. Meanwhile, when an element is referred to as being "directly beneath" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a flowchart showing a method for manufacturing a thin film transistor array panel according to an exemplary embodiment of the present invention.

Referring to FIG. 1, a method for manufacturing a thin film transistor array panel according to an exemplary embodiment of the present invention includes forming a gate electrode (S1), forming a gate insulating layer (S2), and forming an oxide semiconductor layer (S3).

The oxide semiconductor layer is a layer including a channel part of a thin film transistor, which will be formed later.

At this time, the first heat treatment process is performed (S4).

The first heat treatment process is performed in a pressurized state. In detail, the pressurized state may be more than 1 atmosphere and at most 50 or less atmospheres.

As an example, while not limited thereto, the first heat treatment process may be performed at at least 5 or more atmospheres and at most 30 or less atmospheres.

Also, the first heat treatment process may be performed at a low temperature of at most 400 or lower degrees for at least about 30 or more minutes. Here, the degree is denoted in centigrade. Throughout the detailed description, the temperatures are denoted in centigrade.

Thereafter, an etch stopper may be formed on the oxide semiconductor layer (S5).

The etch stopper may be made of silicon oxide ($SiO_2$) to correspond to the channel part of the oxide semiconductor layer.

At this time, the second heat treatment process may be performed (S6).

The second heat treatment process may be performed under the same condition as the above-described first heat treatment process.

The second heat treatment process may be performed at more than 1 atmosphere and at most 50 or less atmospheres at a temperature of at most 400 or lower degrees for at least about 30 or more minutes.

As an example, while not limited thereto, the second heat treatment process may be performed at at least 5 or more atmospheres and at most 30 or less atmospheres.

One of the first heat treatment process and the second heat treatment process may be omitted.

Thereafter, a source electrode and a drain electrode are formed on the oxide semiconductor layer S7.

The source electrode or the drain electrode functions as an input or output terminal of the thin film transistor along with a gate electrode.

The source electrode and the drain electrode may be made of a material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti).

Thereafter, a passivation layer may be formed on the source electrode and the drain electrode (S8).

The passivation layer may be formed of silicon oxide, silicon nitride, or an organic layer.

Thereafter, the third heat treatment process may be performed (S9).

The third heat treatment process may be performed at a temperature of at least 200 or higher degrees to at most 1000 or lower degrees and at 1 atmosphere.

The third heat treatment process has an effect of improving the characteristics of the thin film transistor.

However, the third heat treatment process is not absolutely necessary, and this process may be omitted.

Thereafter, a contact hole penetrating the passivation layer may be formed, a pixel electrode may be formed on the passivation layer, and the pixel electrode may be electrically connected to the drain electrode through the contact hole.

Hereinafter, a method for manufacturing a thin film transistor array panel according to the exemplary embodiment of FIG. 1 will be described with reference to FIG. 2, FIG. 3, FIG. 4, FIG. 5, and FIG. 6.

FIG. 2, FIG. 3, FIG. 4, FIG. 5, and FIG. 6 are cross-sectional views showing a method for manufacturing a thin film transistor array panel according to the exemplary embodiment of FIG. 1.

Figure 2:
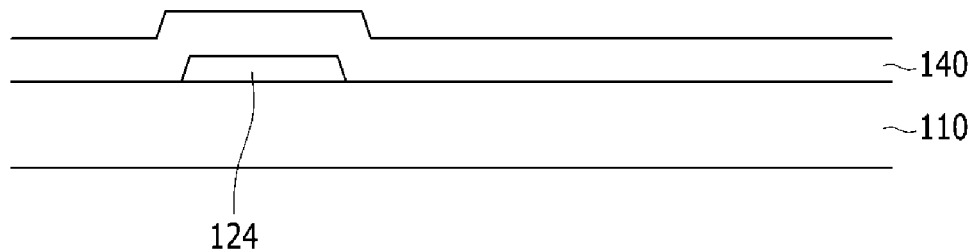
FIG. 2, FIG. 3, FIG. 4, FIG. 5, and FIG. 6 are cross-sectional views showing a method for manufacturing a thin film transistor array panel according to the exemplary embodiment of FIG. 1.

Referring to FIG. 2, a gate electrode 124 is formed on a substrate 110. For example, the substrate 110 may be made of transparent glass or plastic.

The gate electrode 124 may be made of an aluminum-based metal such as aluminum (Al), an aluminum alloy, and the like, a silver-based metal such as silver (Ag), a silver alloy, and the like, a copper-based metal such as copper (Cu), a copper alloy, and the like, a molybdenum-based metal such as molybdenum (Mo), a molybdenum alloy, and the like, chromium (Cr), titanium (Ti), tantalum (Ta), manganese (Mn), and the like.

In an exemplary embodiment, the gate electrode 124 is formed as a single-layer, but it is not limited thereto and may be formed as a double-layer or triple-layer. Thereafter, a gate insulating layer 140 covering the gate electrode 124 is formed on the substrate 110. The gate insulating layer 140 may be formed of silicon oxide, silicon nitride, or silicon-oxynitride (SiON) through a sputtering method. The gate insulating layer 140 is formed as a single layer, but it is not limited thereto and may be formed as a double-layer of silicon oxide and silicon nitride or silicon oxide and silicon-oxynitride. At this time, the layer made of silicon oxide may be a layer adjacent to a semiconductor layer 154, which will be described later.

Figure 3:
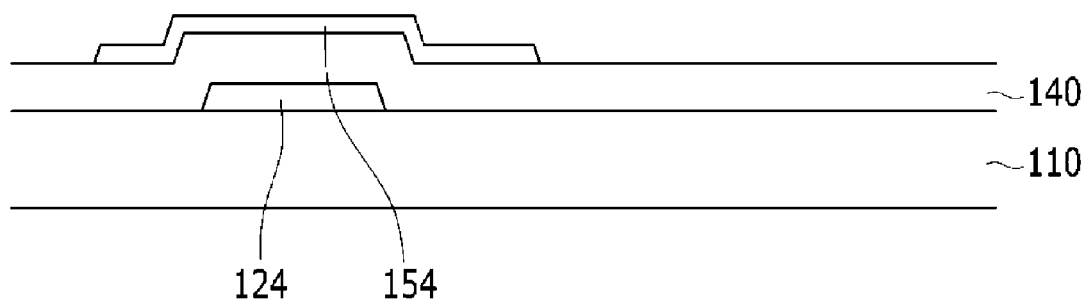

Referring to FIG. 3, after forming a semiconductor material on the gate insulating layer 140, the semiconductor material is patterned to form a semiconductor layer 154. The semiconductor layer 154 may be formed of an oxide semiconductor. In the present exemplary embodiment, the oxide semiconductor includes at least one of tantalum (Ta), zinc (Zn), indium (In), tin (Sn), gallium (Ga), and hafnium (Hf). Particularly, in the present exemplary embodiment, the semiconductor layer 154 may be tantalum-indium-zinc oxide (TaIZO). In case the semiconductor layer 154 is formed of tantalum-indium-zinc oxide (TaIZO), a content of tantalum may be from 2 at % to 5 at %, a content of indium may be from 20 at % to 25 at %, a content of zinc may be from 17 at % to 20 at %, and the rest may be oxygen.

The semiconductor layer 154 may be formed by using chemical vapor deposition, sputtering, pulse laser deposition, atomic layer deposition, spin coating, inkjet printing, a roll-to-roll method, or nano-imprinting. Also, the gate insulating layer 140, which includes the silicon-is based oxide or the silicon-based nitride, is formed by chemical vapor deposition, sputtering, or atomic layer deposition which enables deposition in a plasma environment. In the exemplary embodiment of the present invention, the oxide semiconductor may have an amorphous structure or a crystalline structure. The first heat treatment process may be performed after forming the semiconductor layer 154. The first heat treatment process is performed in the pressurized state of more than 1 atmosphere and at most 50 or less atmospheres. Also, the first heat treatment process may be performed at a low temperature of at most 400 or lower degrees for more than at least about 30 or more minutes. As an example, while not limited thereto, the first heat treatment process may be performed at at least 5 or more atmospheres and at most 30 or less atmospheres. In the present exemplary embodiment, the heat treatment process is performed in the pressurized state without the covering of the metal material and the insulating material such that a semiconductor having a thin film transistor characteristic may be formed at a low temperature below 300 degrees.

The first heat treatment process may be performed before patterning the semiconductor material to form the semiconductor layer 154. The crystalline structure of the oxide semiconductor before the first heat treatment process is the same as the crystalline structure of the oxide semiconductor after the first heat treatment process. In detail, when the oxide semiconductor before the first heat treatment process has the amorphous structure, the amorphous structure is maintained after the heat treatment is performed, and when the oxide semiconductor before the first heat treatment process has the crystalline structure, the crystalline structure is maintained after the first heat treatment.

Figure 4:
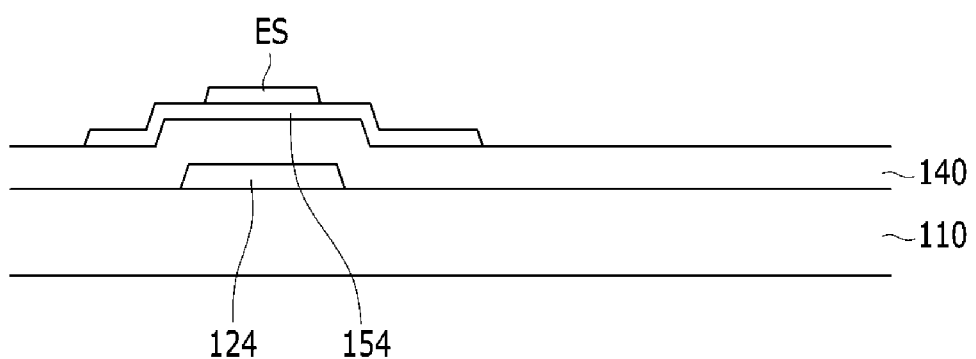

Referring to FIG. 4, an etch stopper ES is formed at a position corresponding to a channel region of the semiconductor layer 154. The etch stopper ES may be formed of a silicon-is based oxide or nitride. The second heat treatment process may be performed after forming the etch stopper ES. The second heat treatment process may be performed under the same condition as the above-described first heat treatment process. The second heat treatment process may be performed at more than 1 atmosphere and at most 50 or less atmospheres at a temperature of at most 400 or lower degrees for at least about 30 or more minutes. As an example, while not limited thereto, the second heat treatment process may be performed at at least 5 or more atmospheres and at most 30 or less atmospheres.

Figure 5:
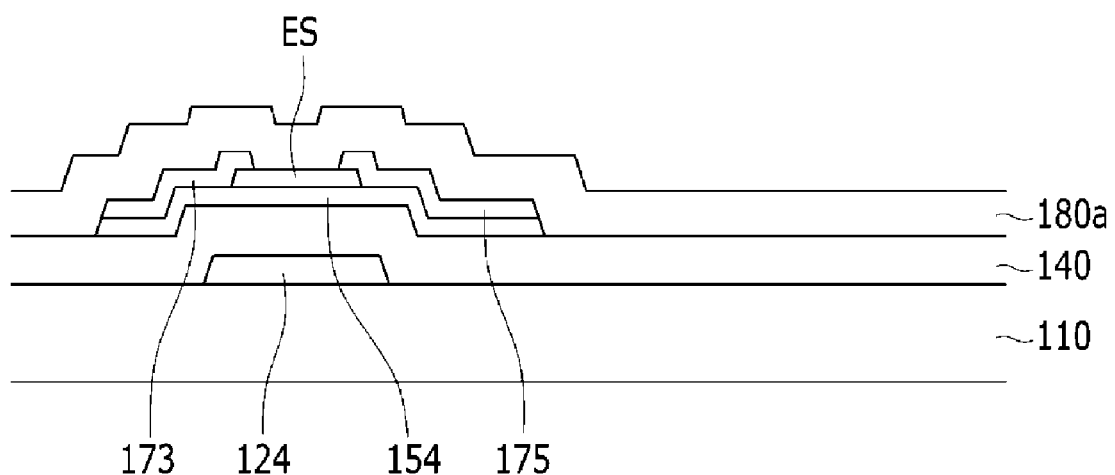

By performing the second heat treatment process, an interface characteristic of the etch stopper ES and the semiconductor layer 154 may be improved. Referring to FIG. 5, a source electrode 173 and a drain electrode 175 overlapping edges of the etch stopper ES are formed. The source electrode 173 and the drain electrode 175 face each other with respect to the gate electrode 124. The etch stopper ES is partially exposed at the position where the source electrode 173 and the drain electrode 175 are separated from each other.

The source electrode 173 and the drain electrode 175 may be made of a material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti). For example, the molybdenum alloy may be Mo—Nb or Mo—Ti. Also, the source electrode 173 and the drain electrode 175 may be formed of a transparent conductive material such as ITO, IZO, and AZO.

Figure 6:
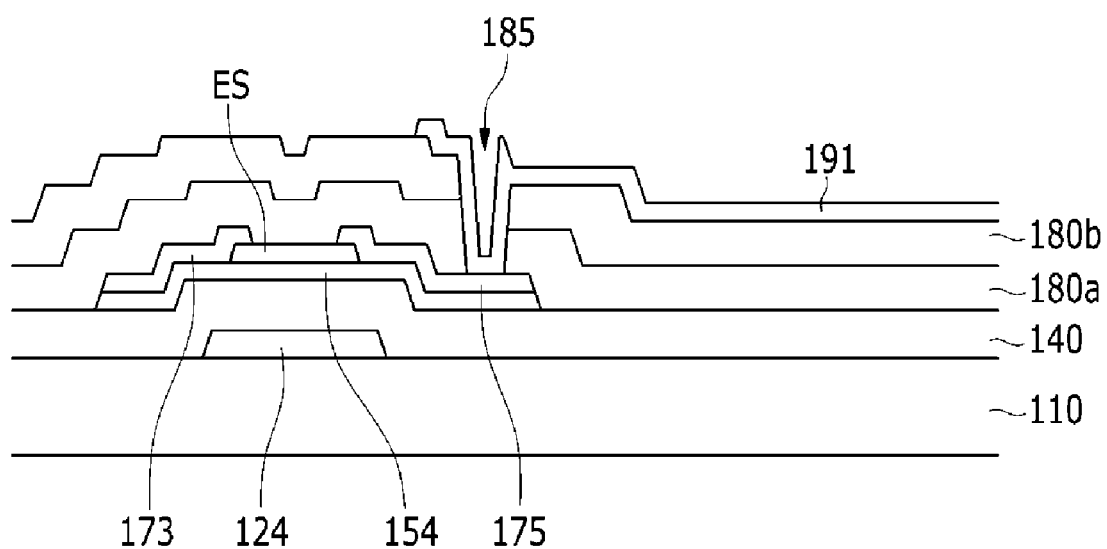

The source electrode 173 and the drain electrode 175 may have a multilayered structure including at least two conductive layers (not shown). As examples, there are Mo/Al/Mo, Mo/Al, Mo/Cu, CuMn/Cu, and Ti/Cu. A lower passivation layer 180a covering the is exposed surface of the etch stopper ES, the source electrode 173, and the drain electrode 175 is formed on the gate insulating layer 140. The lower passivation layer 180a may be formed of aluminum oxide ($Al_2O_3$), silicon oxide, silicon nitride, silicon oxynitride (SiON), or the organic layer. The third heat treatment process may be performed after forming the lower passivation layer 180a. The third heat treatment process may be performed at a temperature of at most 400 or lower degrees and at about 1 atmosphere. The third heat treatment process has the effect of further improving the characteristics of the thin film transistor. However, the third heat treatment process is not absolutely necessary, and this process may be omitted. Referring to FIG. 6, a contact hole 185 is formed in the lower passivation layer 180a, and then a pixel electrode 191 is formed. The pixel electrode 191 is connected to the drain electrode 175 through the contact hole 185. An upper passivation layer 180b may be formed on the lower passivation layer 180a before forming the pixel electrode 191. In case the upper passivation layer 180b is formed, the lower passivation layer 180a may be formed of silicon oxide, silicon nitride, or silicon oxynitride (SiON), and the upper passivation layer 180b may be formed of the organic layer.

A later heat treatment may be performed to form an organic planarizing layer (not shown) after forming the pixel electrode 191. The later heat treatment may be performed at a temperature below 300 degrees, particularly at about 230 degrees, for about one hour.

Figure 7:
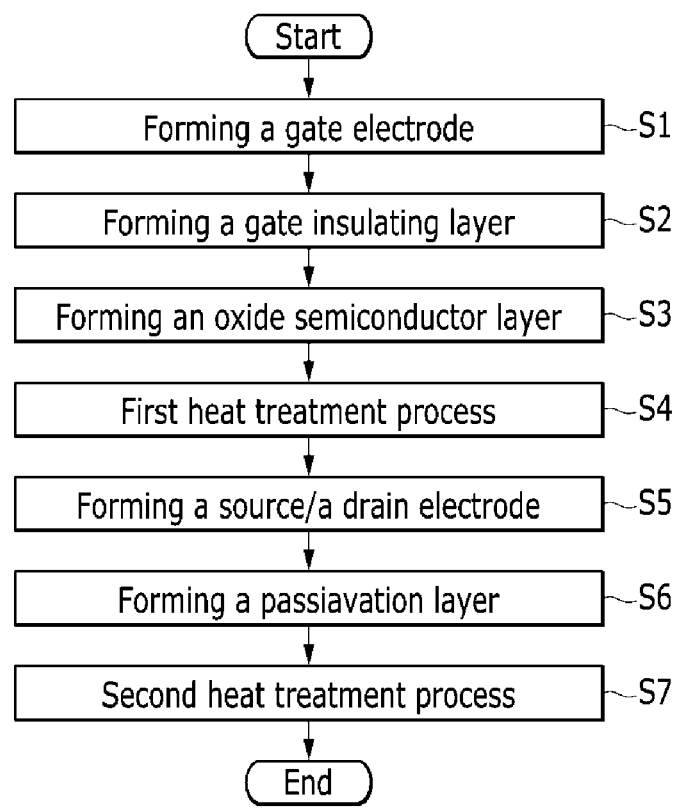
FIG. 7 is a flowchart showing a method for manufacturing a thin film transistor array panel according to another exemplary embodiment of the present invention.

FIG. 7 is a flowchart of a method for manufacturing a thin film transistor array panel according to another exemplary embodiment of the present invention. Referring to FIG. 7, a method for manufacturing a thin film transistor array panel according to another exemplary embodiment of the present invention includes forming a gate electrode (S1), forming a gate insulating layer (S2), and forming an oxide semiconductor layer (S3). The oxide semiconductor layer is a layer including a channel part of a thin film transistor, which will be formed later.

At this time, the first heat treatment process is performed (S4).

The first heat treatment process is performed in a pressurized state. In detail, the pressurized state may be at more than 1 atmosphere and at most 50 or less atmospheres. As an example, while not limited thereto, the first heat treatment process may be performed at at least 5 or more atmospheres and at most 30 or less atmospheres. Also, the first heat treatment process may be performed at a low temperature below 300 degrees for at least about 30 or more minutes. Thereafter, a source electrode and a drain electrode are formed on the oxide semiconductor layer S5.

The source electrode and the drain electrode function as an input or output terminal of the thin film transistor along with a gate electrode. The source electrode and the drain electrode may be made of a material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti). Thereafter, a passivation layer may be formed on the source electrode and the drain electrode S6. The passivation layer may be formed of silicon oxide, silicon nitride, or an organic layer.

At this time, the second heat treatment process may be performed (S7).

The second heat treatment process may be performed at a temperature of at least 200 or higher degrees and at most 1000 or lower degrees and at about 1 atmosphere. The second heat treatment process has the effect of further improving the characteristics of the thin film transistor. However, the second heat treatment process is not absolutely necessary, and this process may be omitted.

Thereafter, a contact hole penetrating the passivation layer may be formed, a pixel electrode may be formed on the passivation layer, and the pixel electrode may be electrically connected to the drain electrode through the contact hole.

Hereinafter, a method for manufacturing a thin film transistor array panel according to the exemplary embodiment of FIG. 7 will be described with reference to FIG. 8, FIG. 9, FIG. 10, and FIG. 11.

Figure 8:
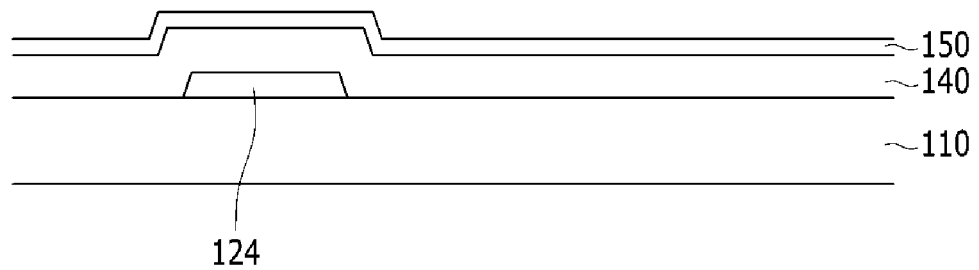
FIG. 8, FIG. 9, FIG. 10, and FIG. 11 are cross-sectional views showing a method for manufacturing a thin film transistor array panel according to the exemplary embodiment of FIG. 7.

FIG. 8, FIG. 9, FIG. 10, and FIG. 11 are cross-sectional views showing a method for manufacturing a thin film transistor array panel according to the exemplary embodiment of FIG. 7. Referring to FIG. 8, a gate electrode 124 is formed on a substrate 110 made of transparent glass or plastic. The gate electrode 124 may be made of an aluminum-based metal such as aluminum (Al), an aluminum alloy, and the like, a silver-based metal such as silver (Ag), a silver alloy, and the like, a copper-based metal such as copper (Cu), a copper alloy, and the like, a molybdenum-based metal such as molybdenum (Mo), a molybdenum alloy, and the like, chromium (Cr), titanium (Ti), tantalum (Ta), manganese (Mn), and the like.

In the exemplary embodiment, the gate electrode 124 is formed as a single layer, but it is not limited thereto and may be formed as a double layer or a triple layer. A gate insulating layer 140 covering the gate electrode 124 may be formed on the substrate 110. The gate insulating layer 140 may be formed of silicon oxide, silicon nitride or silicon oxynitride (SiON) through a sputtering method.

The gate insulating layer 140 is formed as single layer, but it is not limited thereto and may be formed as a double layer of silicon oxide and silicon nitride or silicon oxide and silicon oxynitride. At this time, the layer made of silicon oxide may be a layer adjacent to a semiconductor layer 154, which will be described later. A semiconductor material layer 150 is formed on the gate insulating layer 140. The semiconductor material layer 150 may be formed of an oxide semiconductor.

In the present exemplary embodiment, the oxide semiconductor includes at least one of tantalum (Ta), zinc (Zn), indium (In), tin (Sn), gallium (Ga), and hafnium (Hf). Particularly, in the present exemplary embodiment, the semiconductor material layer 150 may be formed of tantalum-indium-zinc oxide (TaIZO). In case the semiconductor material layer 150 is formed of tantalum-indium-zinc oxide (TaIZO), a content of tantalum may be from 2 at % to 5 at %, a content of indium may be from 20 at % to 25 at %, a content of zinc may be from 17 at % to 20 at %, and the rest may be oxygen.

The semiconductor material layer 150 may be formed by using chemical vapor deposition, sputtering, pulse laser deposition, atomic layer deposition, spin coating, inkjet printing, a roll-to-roll method, or nano-imprinting. Also, the insulating layer including the silicon-based oxide or the silicon-based nitride may be formed by chemical vapor deposition, sputtering, or atomic layer deposition which enables deposition in a plasma environment.

In the exemplary embodiment of the present invention, the oxide semiconductor may have an amorphous structure or a crystalline structure. The first heat treatment process may be performed after forming the semiconductor material layer 150. The first heat treatment process may be performed in the pressurized state of more than 1 atmosphere and at most 50 or less atmospheres. Also, the first heat treatment process may be performed at a low temperature below 300 degrees for at least about 30 or more minutes. As an example, while not limited thereto, the first heat treatment process may be performed at at least 5 or more atmospheres and at most 30 or less atmospheres.

The heat treatment process is performed in the pressurized state without the covering by the metal material and the insulating material such that the semiconductor having a thin film transistor characteristic may be formed at a low temperature below 300 degrees. The crystalline structure of the oxide semiconductor before the first heat treatment process is the same as the crystalline structure of the oxide semiconductor after the first heat treatment process. In detail, when the oxide semiconductor before the heat treatment process has the amorphous structure, the amorphous structure is maintained after the heat treatment is performed, and when the oxide semiconductor before the heat treatment process has the crystalline structure, the crystalline structure is maintained after the heat treatment.

Figure 9:
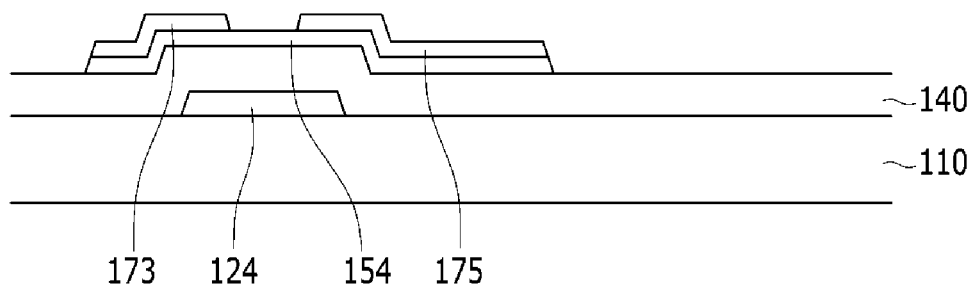

Referring to FIG. 9, after a metal layer is formed on the semiconductor material layer 150, the metal layer is etched through the patterning process to form a source electrode 173 and a drain electrode 175 facing each other with reference to the oxide semiconductor layer 154 and the gate electrode 124.

The source electrode 173 and the drain electrode 175 may be made of a material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti). For example, the molybdenum alloy may be Mo—Nb or Mo—Ti. Also, the source electrode 173 and the drain electrode 175 may be formed of a transparent conductive material such as ITO, IZO, and AZO.

The source electrode 173 and the drain electrode 175 may have a multilayered structure including at least two conductive layers (not shown). As examples, there are Mo/Al/Mo, Mo/Al, Mo/Cu, CuMn/Cu, and Ti/Cu.

Figure 10:
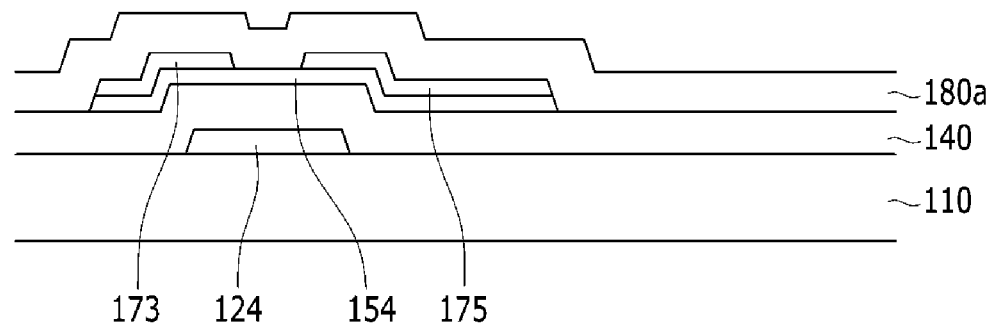

Referring to FIG. 10, a lower passivation layer 180a covering the source electrode 173 and the drain electrode 175 is formed on the gate insulating layer 140. The lower passivation layer 180a may be formed of silicon oxide, silicon nitride, silicon oxynitride (SiON), or the organic layer.

The second heat treatment process may be performed after forming the lower passivation layer 180a. The second heat treatment process may be performed at a temperature of at most 400 or lower degrees and at about 1 atmosphere. The second heat treatment process has the effect of further improving the characteristics of the thin film transistor. However, the second heat treatment process is not absolutely necessary, and this process may be omitted.

Figure 11:
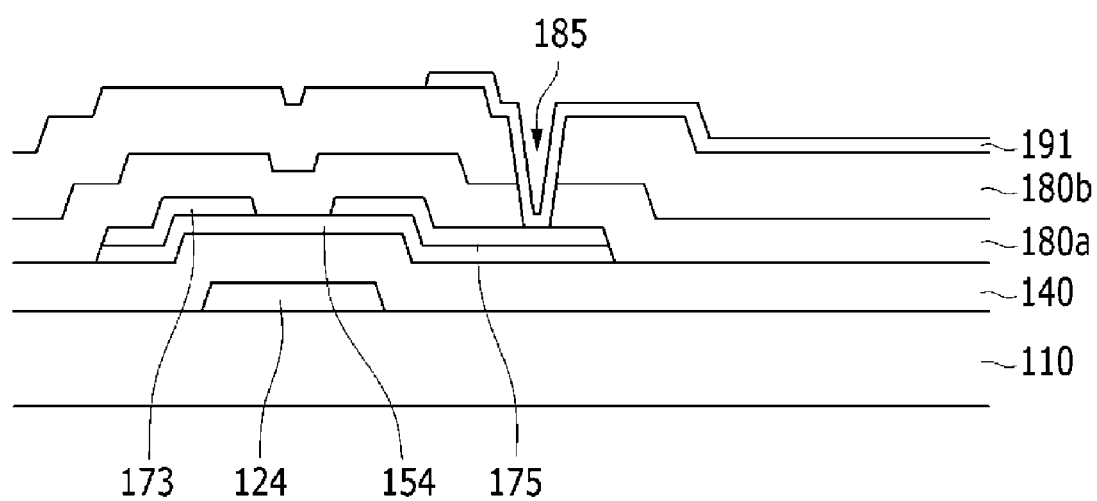

Referring to FIG. 11, a contact hole 185 is formed in the lower passivation layer 180a, and then a pixel electrode 191 is formed. The pixel electrode 191 is connected to the drain electrode 175 through the contact hole 185. An upper passivation layer 180b may be formed on the lower passivation layer 180a before forming the pixel electrode 191. In case the upper passivation layer 180b is formed, the lower passivation layer 180a may be formed of silicon oxide, silicon nitride, or silicon oxynitride (SiON), and the upper passivation layer 180b may be formed of the organic layer. A later heat treatment may be performed to form an organic planarizing layer (not shown) after forming the pixel electrode 191. The later heat treatment may be performed at a temperature below 300 degrees, particularly at a temperature of about 230 degrees, for about one hour. The exemplary embodiment of FIG. 8, FIG. 9, FIG. 10, and FIG. 11 is a bottom gate structure, however the present exemplary embodiment may still be applied to a top gate structure.

Figure 12:
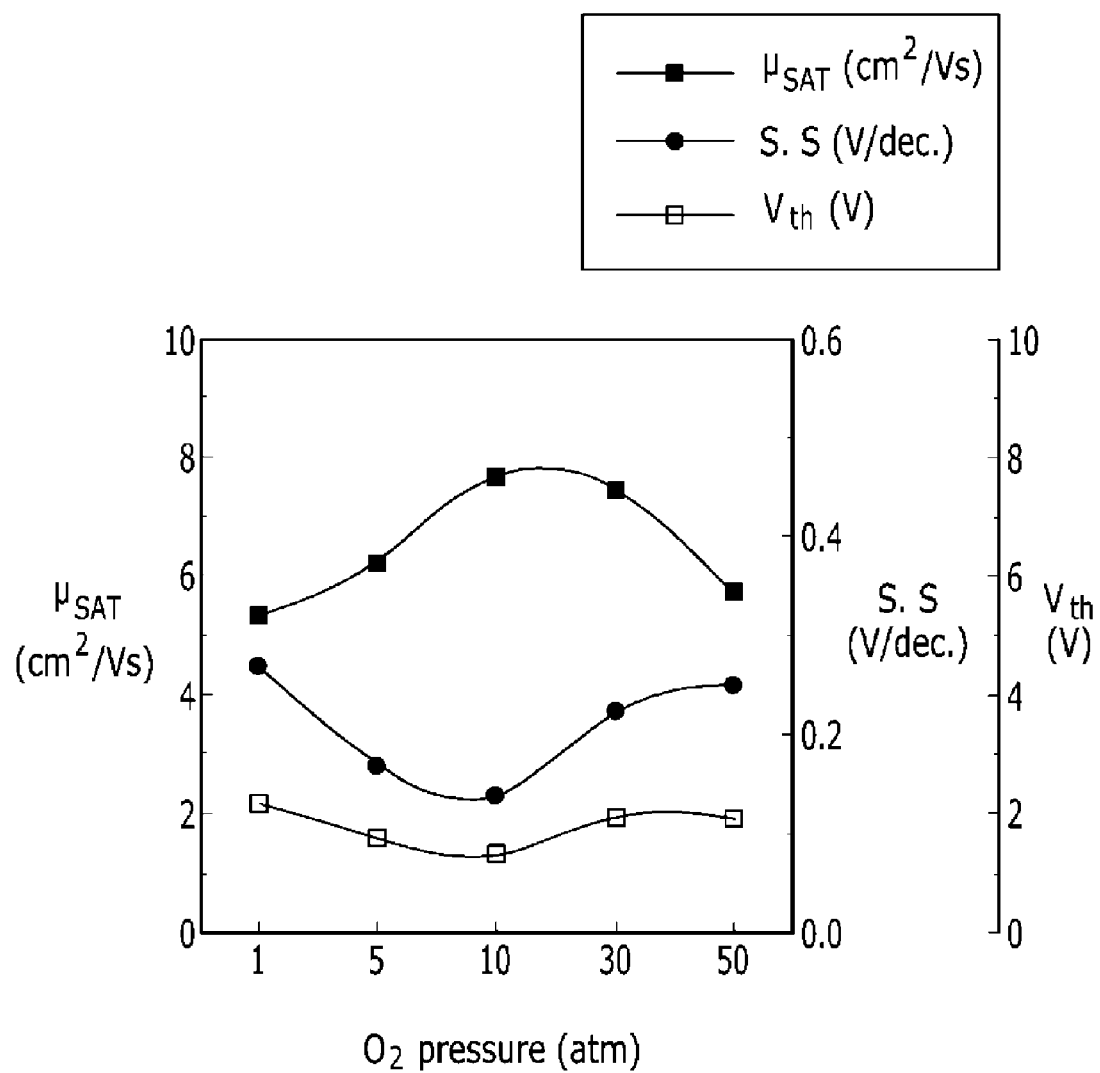
FIG. 12 is a graph showing a characteristic of a thin film transistor according to a pressure in an exemplary embodiment of the present invention and a comparative example.

FIG. 12 is a graph showing a characteristic of a thin film transistor according to pressure in an exemplary embodiment of the present invention and a comparative example. Referring to FIG. 12, when comparing an oxygen pressure with a comparative example of 1 atmosphere, if the heat treatment process is carried out as in the present exemplary embodiment, a value of μSAT representing charge mobility is increased. Also, if the pressure is applied in the heat treatment process, a value of a slope (Threshold Slope; S.S) after a threshold voltage is decreased.

Also, even though the pressure is applied in the heat treatment process, Vth representing the threshold voltage is marginally changed. As described above, as in an exemplary embodiment of the present invention, the heat treatment process is performed in the pressurized condition between 1 atmosphere and 50 atmospheres such that it may be confirmed that the characteristics of the thin film transistor is improved. Also, referring to FIG. 12, when the pressurized condition is in the range of at least 5 or more atmospheres and at most 30 or less atmospheres, it may be confirmed that the thin film transistor characteristics is remarkably improved.

Figure 13:
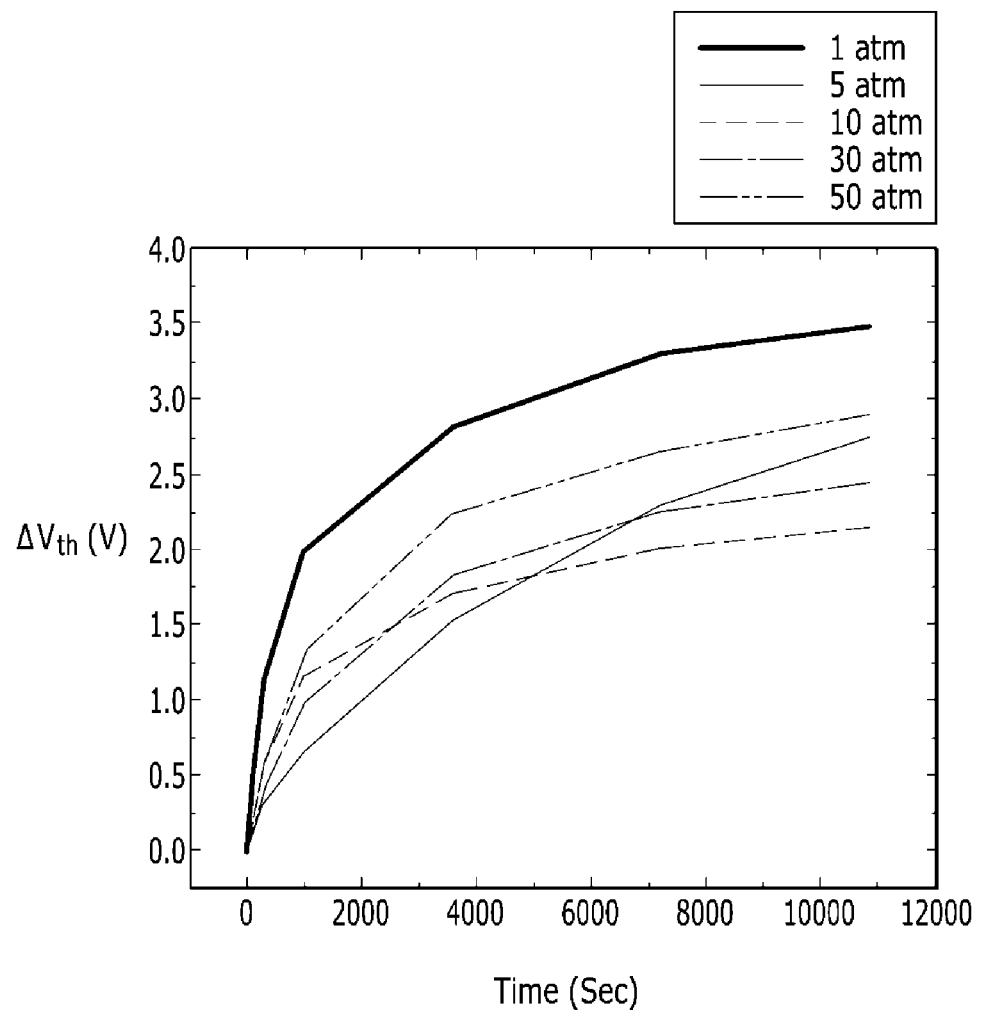
FIG. 13 is a graph measuring a PBTS (positive bias temperature stress) value according to a pressure in an exemplary embodiment of the present invention and a comparative example.

FIG. 13 is a graph measuring a PBTS (positive bias temperature stress) value according to a pressure in an exemplary embodiment of the present invention and a comparative example.

FIG. 13 measures a PBTS value in a viewpoint of the reliability, and referring to FIG. 13, in the pressurized state in the range of more than 1 atmospheres and at most 50 or less atmospheres, the value ΔVth representing the change of the threshold voltage is decreased compared with 1 atmosphere which corresponds to a standard process. Although not shown, as a result of measuring the NBTS (negative bias temperature stress) value in a viewpoint of reliability, in the pressurized state in the range of more than 1 atmosphere and at most 50 or less atmospheres, the value ΔVth representing the change of the threshold voltage is also decreased compared with 1 atmosphere which corresponds to the standard process.

The above-described thin film transistor array panel may be applied to a flat panel display such as a liquid crystal display or an organic light emitting device. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a thin film transistor array panel, comprising:
   forming a gate electrode, a gate insulating layer, and an oxide semiconductor layer on a substrate;
   performing a first heat treatment on the substrate comprising the oxide semiconductor layer, at a pressure in the range of more than 1 atmosphere to 50 atmospheres;
   forming a source electrode and a drain electrode on the oxide semiconductor layer, after performing the first heat treatment; and
   forming a passivation layer on the source electrode and the drain electrode,
   wherein the first heat treatment does not change a crystalline structure of the oxide semiconductor layer.

2. The method of claim 1, wherein the first heat treatment is performed at a temperature of at most 400° C.

3. The method of claim 1, further comprising forming a pixel electrode on the passivation layer.

4. The method of claim 1, wherein the oxide semiconductor comprises one of tantalum-indium-zinc oxide, indium-zinc-tin oxide, and indium-gallium-zinc oxide.

5. The method of claim 2, wherein the first heat treatment is performed for at least 30 minutes.

6. The method of claim 5, further comprising performing a second heat treatment after forming the passivation layer.

7. The method of claim 6, wherein the second heat treatment is performed at a temperature of 400° C. or less.

8. The method of claim 7, wherein the second heat treatment is performed at 1 atmosphere.

9. The method of claim 8, wherein the first heat treatment is performed at a pressure in the range of 5 atmospheres to 30 atmospheres.

10. The method of claim 3, further comprising performing a heat treatment on the substrate comprising the pixel electrode.

11. A method for manufacturing a thin film transistor array panel, comprising:
    forming a gate electrode, a gate insulating layer, and an oxide semiconductor layer on a substrate;
    forming an etch stopper on the oxide semiconductor layer;
    performing a first heat treatment on the substrate comprising the etch stopper, at a pressure in the range of more than 1 atmosphere to 50 atmospheres;
    forming a source electrode and a drain electrode on the oxide semiconductor layer, the source and drain electrodes contacting opposing portions of the etch stopper; and
    forming a passivation layer on the substrate comprising the source electrode and the drain electrode.

12. The method of claim 11, wherein the first heat treatment is performed at a temperature of 400° C. or less.

13. The method of claim 12, wherein the first heat treatment is performed for at least 30 minutes.

14. The method of claim 13, further comprising performing a second heat treatment on the substrate comprising the passivation layer.

15. The method of claim 14, wherein the second heat treatment is performed at a temperature of 400° C. or less.

16. The method of claim 15, wherein the second heat treatment is performed at 1 atmosphere.

17. The method of claim 16, wherein the first heat treatment is performed at a pressure in the range of 5 atmospheres to 30 atmospheres.

* * * * *